(12) United States Patent
Dane et al.

(10) Patent No.: US 10,588,236 B2
(45) Date of Patent: Mar. 10, 2020

(54) MODULAR PROTECTION CABINET WITH FLEXIBLE BACKPLANE

(71) Applicant: Transtector Systems, Inc., Hayden, ID (US)

(72) Inventors: Kelly A. Dane, Athol, ID (US); William K. Magee, Rathdrum, ID (US)

(73) Assignee: TRANSTECTOR SYSTEMS, INC., Hayden, ID (US)

( * ) Notice: Subject to any disclaimer, the term of this patent is extended or adjusted under 35 U.S.C. 154(b) by 0 days.

(21) Appl. No.: 15/948,932

(22) Filed: Apr. 9, 2018

(65) Prior Publication Data

US 2018/0235099 A1   Aug. 16, 2018

Related U.S. Application Data

(63) Continuation-in-part of application No. 15/899,293, filed on Feb. 19, 2018, now Pat. No. 10,356,928, which is a continuation-in-part of application No. 15/216,537, filed on Jul. 21, 2016, now Pat. No. 9,924,609.

(60) Provisional application No. 62/196,837, filed on Jul. 24, 2015.

(51) Int. Cl.
*H05K 7/14* (2006.01)
*H05K 5/00* (2006.01)

(52) U.S. Cl.
CPC ......... *H05K 7/1458* (2013.01); *H05K 5/0034* (2013.01)

(58) Field of Classification Search
None
See application file for complete search history.

(56) References Cited

U.S. PATENT DOCUMENTS

| | | | |
|---|---|---|---|
| 2,030,179 A | | 2/1936 | Potter |
| 2,857,558 A | * | 10/1958 | Fiske ............... B65D 85/38 312/323 |
| 3,167,729 A | | 1/1965 | Hall |
| 3,323,083 A | | 5/1967 | Ziegler |
| 3,596,165 A | | 7/1971 | Andrews |
| 3,619,721 A | | 11/1971 | Westendorp |
| 3,662,225 A | * | 5/1972 | Carter ............... H05K 7/16 361/727 |
| 3,663,901 A | | 5/1972 | Forney, Jr. |
| 3,731,234 A | | 5/1973 | Collins |
| 3,750,053 A | | 7/1973 | LeDonne |
| 3,783,178 A | | 1/1974 | Philibert |

(Continued)

FOREIGN PATENT DOCUMENTS

CH   675933   11/1990
JP   08-066037   3/1996

(Continued)

*Primary Examiner* — Xanthia C Cunningham
(74) *Attorney, Agent, or Firm* — Snell & Wilmer LLP

(57) ABSTRACT

An enclosure for an electronic device. The enclosure has a rear base defining a cavity for holding the electronic device and having one or more input/output connectors. The enclosure has a front cover coupled to the rear base. The enclosure has a backplane within the cavity of the rear base. The backplane has a printed circuit board. The enclosure has as interconnect that electrically connects the printed circuit board with the one or more input/output connectors. The interconnect has a cross-hatched ground (or power) plane.

20 Claims, 18 Drawing Sheets

(56) References Cited

U.S. PATENT DOCUMENTS

| | | | |
|---|---|---|---|
| 3,831,110 A | 8/1974 | Eastman | |
| 3,832,627 A | 8/1974 | Ohsawa | |
| 3,845,358 A | 10/1974 | Anderson et al. | |
| 3,921,015 A | 11/1975 | Obeda et al. | |
| 3,944,937 A | 3/1976 | Fujisawa et al. | |
| 3,956,717 A | 5/1976 | Fisher et al. | |
| 3,980,976 A | 9/1976 | Tadama et al. | |
| 4,021,759 A | 5/1977 | Camp | |
| 4,046,451 A | 9/1977 | Juds et al. | |
| 4,047,120 A | 9/1977 | Lord et al. | |
| 4,058,890 A * | 11/1977 | Pierce | H05K 7/1417 16/266 |
| 4,112,395 A | 9/1978 | Seward | |
| 4,237,546 A * | 12/1980 | Wells | H05K 1/14 361/679.31 |
| 4,262,317 A | 4/1981 | Baumbach | |
| 4,287,764 A * | 9/1981 | Staab | G01N 33/0009 361/714 |
| 4,356,360 A | 10/1982 | Volz | |
| 4,359,764 A | 11/1982 | Block | |
| 4,384,331 A | 5/1983 | Fukuhara et al. | |
| 4,409,637 A | 10/1983 | Block | |
| 4,481,641 A | 11/1984 | Gable et al. | |
| 4,498,717 A * | 2/1985 | Reimer | H05K 7/1445 361/788 |
| 4,554,608 A | 11/1985 | Block | |
| 4,563,720 A | 1/1986 | Clark | |
| 4,586,104 A | 4/1986 | Standler | |
| 4,679,121 A * | 7/1987 | Schomers | H05K 1/0228 361/729 |
| 4,689,713 A | 8/1987 | Hourtane et al. | |
| 4,698,721 A | 10/1987 | Warren | |
| 4,727,350 A | 2/1988 | Ohkubo | |
| 4,838,798 A * | 6/1989 | Evans | H01R 12/00 439/61 |
| 4,883,429 A * | 11/1989 | Suzuki | H05K 7/1452 439/74 |
| 4,901,183 A | 2/1990 | Lee | |
| 4,952,173 A | 8/1990 | Peronnet et al. | |
| 4,984,146 A | 1/1991 | Black et al. | |
| 4,985,800 A | 1/1991 | Feldman et al. | |
| 5,053,910 A | 10/1991 | Goldstein | |
| 5,057,964 A | 10/1991 | Bender et al. | |
| 5,093,759 A * | 3/1992 | Davis | H05K 7/20545 361/721 |
| 5,102,818 A | 4/1992 | Paschke et al. | |
| 5,122,921 A | 6/1992 | Koss | |
| 5,124,873 A | 6/1992 | Wheeler | |
| 5,142,429 A | 8/1992 | Jaki | |
| 5,166,855 A | 11/1992 | Turner | |
| 5,170,151 A | 12/1992 | Hochstein | |
| 5,278,720 A | 1/1994 | Bird | |
| 5,285,018 A * | 2/1994 | Pence, IV | H01L 23/50 174/255 |
| 5,321,573 A | 6/1994 | Persona et al. | |
| 5,325,270 A * | 6/1994 | Wenger | H05K 7/1441 361/796 |
| 5,353,189 A | 10/1994 | Tomlinson | |
| 5,412,526 A | 5/1995 | Kapp et al. | |
| 5,442,330 A | 8/1995 | Fuller et al. | |
| 5,534,768 A | 7/1996 | Chavannes et al. | |
| 5,537,044 A | 7/1996 | Stahl | |
| 5,584,396 A * | 12/1996 | Schmitt | H02B 1/36 211/26 |
| 5,611,224 A | 3/1997 | Weinerman et al. | |
| 5,617,284 A | 4/1997 | Paradise | |
| 5,625,521 A | 4/1997 | Luu | |
| 5,667,298 A | 9/1997 | Musil et al. | |
| 5,721,662 A | 2/1998 | Glaser et al. | |
| 5,781,844 A | 7/1998 | Spriester et al. | |
| 5,790,361 A | 8/1998 | Minch | |
| 5,844,766 A | 12/1998 | Miglioli et al. | |
| 5,854,730 A | 12/1998 | Mitchell et al. | |
| 5,863,211 A * | 1/1999 | Sobotta | G06F 1/184 361/735 |
| 5,889,650 A * | 3/1999 | Bertilsson | H05K 7/16 361/610 |
| 5,943,225 A | 8/1999 | Park | |
| 5,953,195 A | 9/1999 | Pagliuca | |
| 5,959,839 A * | 9/1999 | Gates | G06F 1/20 257/719 |
| 5,963,407 A | 10/1999 | Fragapane et al. | |
| 5,966,283 A | 10/1999 | Glaser et al. | |
| 5,973,918 A * | 10/1999 | Felcman | G06F 1/184 361/679.6 |
| 5,982,602 A | 11/1999 | Tellas et al. | |
| 5,984,720 A * | 11/1999 | Milner | G02B 6/3897 439/534 |
| 5,986,869 A | 11/1999 | Akdag | |
| 6,026,458 A | 2/2000 | Rasums | |
| 6,031,705 A | 2/2000 | Gscheidle | |
| 6,054,905 A | 4/2000 | Gresko | |
| 6,060,182 A | 5/2000 | Tanaka et al. | |
| 6,061,223 A | 5/2000 | Jones et al. | |
| 6,076,906 A * | 6/2000 | Royal | A47B 46/00 312/223.1 |
| 6,086,544 A | 7/2000 | Hibner et al. | |
| 6,115,227 A | 9/2000 | Jones et al. | |
| 6,137,352 A | 10/2000 | Germann | |
| 6,141,194 A | 10/2000 | Maier | |
| 6,177,849 B1 | 1/2001 | Barsellotti et al. | |
| 6,195,493 B1 * | 2/2001 | Bridges | G02B 6/4452 385/134 |
| 6,226,166 B1 | 5/2001 | Gumley et al. | |
| 6,236,551 B1 | 5/2001 | Jones et al. | |
| 6,243,247 B1 | 6/2001 | Akdag et al. | |
| 6,252,755 B1 | 6/2001 | Willer | |
| 6,281,690 B1 | 8/2001 | Frey | |
| 6,285,563 B1 * | 9/2001 | Nelson | G11B 33/1413 174/254 |
| 6,292,344 B1 | 9/2001 | Glaser et al. | |
| 6,342,998 B1 | 1/2002 | Bencivenga et al. | |
| 6,381,283 B1 | 4/2002 | Bhardwaj et al. | |
| 6,385,030 B1 | 5/2002 | Beene | |
| 6,388,879 B1 * | 5/2002 | Otaguro | G02B 6/43 361/695 |
| 6,390,831 B2 * | 5/2002 | Shimada | H04Q 1/10 439/74 |
| 6,394,122 B1 | 5/2002 | Sibley et al. | |
| 6,421,220 B2 | 7/2002 | Kobsa | |
| 6,422,876 B1 * | 7/2002 | Fitzgerald | H01R 12/716 361/784 |
| 6,483,029 B1 * | 11/2002 | Lutz, Jr. | H04Q 1/116 174/50 |
| 6,502,599 B1 | 1/2003 | Sibley et al. | |
| 6,527,004 B1 | 3/2003 | Sibley et al. | |
| 6,535,369 B1 | 3/2003 | Redding et al. | |
| 6,721,155 B2 | 4/2004 | Ryman | |
| 6,747,217 B1 * | 6/2004 | Jochym | H01R 12/58 174/265 |
| 6,754,060 B2 | 6/2004 | Kauffman | |
| 6,757,152 B2 | 6/2004 | Galvagni et al. | |
| 6,785,110 B2 | 8/2004 | Bartel et al. | |
| 6,789,560 B1 | 9/2004 | Stoner et al. | |
| 6,814,100 B1 | 11/2004 | Sibley et al. | |
| 6,816,348 B2 | 11/2004 | Chen et al. | |
| 6,930,240 B1 * | 8/2005 | Giboney | H05K 3/361 174/393 |
| 6,940,730 B1 * | 9/2005 | Berg, Jr. | H04Q 1/10 174/383 |
| 6,968,852 B1 | 11/2005 | Sibley | |
| 6,975,496 B2 | 12/2005 | Jones et al. | |
| 7,075,796 B1 * | 7/2006 | Pritchett | G06F 1/184 211/41.17 |
| 7,082,022 B2 | 7/2006 | Bishop | |
| 7,104,282 B2 | 9/2006 | Hooker et al. | |
| 7,106,572 B1 | 9/2006 | Girard | |
| 7,130,103 B2 | 10/2006 | Murata | |
| 7,159,236 B2 | 1/2007 | Abe et al. | |
| 7,221,550 B2 | 5/2007 | Chang et al. | |

(56) References Cited

U.S. PATENT DOCUMENTS

| | | | |
|---|---|---|---|
| 7,240,314 B1* | 7/2007 | Leung | G06F 17/5068 |
| | | | 257/773 |
| 7,250,829 B2 | 7/2007 | Namura | |
| 7,352,576 B2* | 4/2008 | McClure | G06F 1/20 |
| | | | 361/610 |
| 7,430,103 B2 | 9/2008 | Kato | |
| 7,453,268 B2 | 11/2008 | Lin | |
| 7,471,172 B2 | 12/2008 | Holst et al. | |
| 7,507,105 B1 | 3/2009 | Peters et al. | |
| 7,623,332 B2 | 11/2009 | Frank et al. | |
| 7,675,726 B2 | 3/2010 | Bolz et al. | |
| 7,808,752 B2 | 10/2010 | Richiuso et al. | |
| 7,817,398 B1 | 10/2010 | Maples | |
| 8,081,422 B2* | 12/2011 | Shannon | H05K 7/1457 |
| | | | 307/43 |
| 8,112,873 B2* | 2/2012 | Brolin | H05K 7/1459 |
| | | | 29/601 |
| 8,458,958 B2* | 6/2013 | Cress | E05F 5/02 |
| | | | 16/374 |
| 9,190,837 B2 | 11/2015 | Tollefsbol | |
| 2002/0167302 A1 | 11/2002 | Gallavan | |
| 2002/0191360 A1 | 12/2002 | Colombo et al. | |
| 2003/0072121 A1 | 4/2003 | Bartel et al. | |
| 2003/0151870 A1 | 8/2003 | Gronbach et al. | |
| 2003/0161130 A1* | 8/2003 | Yamamoto | H05K 7/1454 |
| | | | 361/796 |
| 2003/0179533 A1 | 9/2003 | Jones et al. | |
| 2003/0211782 A1 | 11/2003 | Esparaz et al. | |
| 2004/0057224 A1* | 3/2004 | Kiko | H05K 1/181 |
| | | | 361/828 |
| 2004/0100751 A1 | 5/2004 | Ammann | |
| 2004/0121648 A1 | 6/2004 | Voros | |
| 2004/0145849 A1 | 7/2004 | Chang et al. | |
| 2004/0156179 A1* | 8/2004 | Hockett | G06F 1/181 |
| | | | 361/796 |
| 2004/0264087 A1 | 12/2004 | Bishop | |
| 2005/0030721 A1* | 2/2005 | Shimada | G06F 1/181 |
| | | | 361/726 |
| 2005/0036262 A1 | 2/2005 | Siebenthall et al. | |
| 2005/0044858 A1 | 3/2005 | Hooker et al. | |
| 2005/0176275 A1 | 8/2005 | Hoopes et al. | |
| 2005/0185354 A1 | 8/2005 | Hoopes | |
| 2005/0206482 A1 | 9/2005 | Du Toit et al. | |
| 2006/0044076 A1 | 3/2006 | Law | |
| 2006/0082946 A1 | 4/2006 | Duenez et al. | |
| 2006/0120005 A1 | 6/2006 | Van Sickle | |
| 2006/0139832 A1 | 6/2006 | Yates et al. | |
| 2006/0146458 A1 | 7/2006 | Mueller | |
| 2006/0171133 A1* | 8/2006 | Pedoeem | H05K 7/1445 |
| | | | 361/796 |
| 2007/0046541 A1* | 3/2007 | Pathak | H01Q 1/243 |
| | | | 343/700 MS |
| 2007/0053130 A1 | 3/2007 | Harwath | |
| 2007/0139850 A1 | 6/2007 | Kamel et al. | |
| 2007/0202753 A1* | 8/2007 | Murakami | H01R 4/185 |
| | | | 439/701 |
| 2007/0232089 A1* | 10/2007 | Fung | H05K 1/14 |
| | | | 439/65 |
| 2008/0170346 A1 | 7/2008 | Van Swearingen | |
| 2008/0298035 A1* | 12/2008 | Kajio | H05K 1/0263 |
| | | | 361/784 |
| 2009/0103226 A1 | 4/2009 | Penwell et al. | |
| 2009/0109584 A1 | 4/2009 | Jones et al. | |
| 2009/0173533 A1* | 7/2009 | Brock | H01R 12/592 |
| | | | 174/350 |
| 2009/0284888 A1 | 11/2009 | Bartel et al. | |
| 2009/0296430 A1 | 12/2009 | Rieux-Lopez et al. | |
| 2010/0271793 A1* | 10/2010 | Doblar | H05K 1/0271 |
| | | | 361/788 |
| 2010/0320187 A1* | 12/2010 | Griffin | H01L 23/345 |
| | | | 219/209 |
| 2011/0058324 A1* | 3/2011 | Huang | G06F 1/182 |
| | | | 361/679.4 |
| 2011/0080683 A1 | 4/2011 | Jones et al. | |
| 2011/0090633 A1* | 4/2011 | Rabinovitz | G06F 1/184 |
| | | | 361/679.31 |
| 2011/0141646 A1 | 6/2011 | Jones et al. | |
| 2011/0159727 A1 | 6/2011 | Howard et al. | |
| 2011/0279943 A1 | 11/2011 | Penwell et al. | |
| 2012/0178273 A1* | 7/2012 | Cipolla | H01R 13/514 |
| | | | 439/65 |
| 2012/0243160 A1* | 9/2012 | Nguyen | G06F 1/181 |
| | | | 361/679.08 |
| 2013/0064506 A1* | 3/2013 | Eberle, Jr. | G02B 6/32 |
| | | | 385/49 |
| 2014/0102626 A1* | 4/2014 | Clayton | H05K 3/363 |
| | | | 156/196 |
| 2015/0002006 A1* | 1/2015 | Segroves | H05K 7/1491 |
| | | | 312/236 |
| 2015/0056865 A1* | 2/2015 | Guo | H01R 13/6658 |
| | | | 439/660 |
| 2015/0268702 A1* | 9/2015 | Huang | G06F 1/187 |
| | | | 361/679.35 |
| 2015/0351233 A1* | 12/2015 | Peterson | H05K 1/0278 |
| | | | 361/785 |
| 2016/0100497 A1* | 4/2016 | Hood | E21B 33/0385 |
| | | | 361/749 |
| 2016/0205800 A1* | 7/2016 | Roberts | H05K 7/14 |
| | | | 361/809 |
| 2017/0054175 A1* | 2/2017 | Wallace | H01M 8/065 |
| 2018/0342821 A1* | 11/2018 | Komiyama | H01R 12/61 |

FOREIGN PATENT DOCUMENTS

| | | | |
|---|---|---|---|
| JP | 11-037400 | 2/1999 | |
| JP | 2002-107185 | 4/2002 | |
| JP | 2003-070156 | 3/2003 | |
| JP | 2003-111270 | 4/2003 | |
| JP | 2018200779 A | * 12/2018 | H01R 12/61 |
| KR | 10-2003-0081041 | 10/2003 | |
| KR | 10-2009-0018497 | 2/2009 | |
| KR | 10-1189670 | 10/2012 | |
| WO | WO 95/10116 | 4/1995 | |
| WO | PCT/US03/17050 | 5/2003 | |
| WO | WO 2011-119723 | 12/2011 | |

\* cited by examiner

MODULAR PROTECTION CABINET WITH FLEXIBLE BACKPLANE

CROSS-REFERENCE TO RELATED APPLICATIONS

This application is a continuation-in-part of U.S. patent application Ser. No. 15/899,293, titled "MODULAR PROTECTION CABINET WITH FLEXIBLE BACKPLANE," filed on Feb. 19, 2018, which is a continuation-in-part of U.S. patent application Ser. No. 15/216,537, titled "MODULAR PROTECTION CABINET WITH FLEXIBLE BACKPLANE," filed on Jul. 21, 2016, now U.S. Pat. No. 9,924,609, which claims the benefit of and priority to U.S. Provisional Application No. 62/196,837, titled "MODULAR PROTECTION CABINET WITH FLEX-BACK BACK PLANE," filed on Jul. 24, 2015, the entirety of these applications is hereby incorporated by reference herein.

STATEMENT REGARDING GOVERNMENT RIGHTS

This invention was made with Government support under Government Contract No. W31P4Q-15-C-0022 awarded by the Department of Defense. The Government has certain rights in this invention.

BACKGROUND

1. Field

The present invention relates to a sealed enclosure for protecting electronics.

2. Description of the Related Art

Enclosures protect electronics that filter signals sent to a host electronic device. The enclosures have electronic circuit boards and wiring that connect, for example, the filter module to the host electronic device. The enclosures, however, use discrete components and gas filter tubes that require a significant amount of wiring which results in difficulty in accessing and/or reconfiguring the different components.

Typically, the electronic circuit boards that provide the connection between a filter module and a host electronic device are fixed within the enclosure. Therefore, the reconfiguration of the enclosure to add another filter module or switch to a different type of filter module may require significant rewiring and configuration changes to the circuitry. Moreover, when a filter module is inserted into the enclosure, the filter module may not directly align with the electronic circuit board within the enclosure.

SUMMARY

One aspect of the subject matter described in this specification is embodied in an enclosure for an electronic device. The enclosure has a rear base defining a cavity for holding the electronic device and having one or more input/output connectors. The enclosure has a front cover coupled to the rear base. The enclosure has a backplane within the cavity of the rear base. The backplane has a printed circuit board. The enclosure has an interconnect that electrically connects the printed circuit board of the backplane with the one or more input/output connectors. The interconnect has a cross-hatched ground (or power) plane.

These and other embodiments may include one or more of the following features. The cross-hatched ground (or power) plane may be formed from a signal routing layer that is etched in a grid pattern. The grid pattern may have multiple lines and multiple voids. The multiple voids may be in between the multiple lines. The multiple lines may be angled relative to one or more traces on the cross-hatched ground (or power) plane.

The interconnect may have a flexible printer circuit, which may have multiple layers. The multiple layers may include a first cover layer, a second cover layer, a first signal routing layer, a second signal routing layer and a flexible laminate. The first cover layer and the second cover layer may enclose the first signal routing layer, the second signal routing layer and the flexible laminate. The flexible laminate may be in between the first signal routing layer and the second signal routing layer.

The first signal routing layer and the second signal routing layer may be etched to form the multiple lines in a grid pattern with the multiple voids in between. The multiple voids may expose the flexible laminate in between to form the cross-hatched ground (or power) plane.

The first cover layer and the second cover layer may be made from an adhesive coated dielectric. The first signal routing layer and the second signal routing layer may be made from a copper foil. The flexible laminate and the etched first signal routing layer and the etched second signal routing layer may allow the interconnect to be flexible. The interconnect may be a flexible interconnect.

In another aspect, the subject matter is embodied in a flexible adapter for connecting a connector and a printed circuit board. The flexible adapter includes multiple cover layers and multiple signal routing layers. The multiple signal routing layers are enclosed within the multiple cover layers. The multiple signal routing layers include a first signal routing layer and a second signal routing layer. The multiple signal routing layers are etched to form a cross-hatched ground (or power) plane. The flexible adapter includes a layer of flexible laminate. The flexible laminate is in between the first signal routing layer and the second signal routing layer and configured to provide added flexibility and/or controlled signal characteristics.

In another aspect, the subject matter is embodied in an enclosure for protecting electronic devices. The enclosure includes a rear base defining a cavity for holding different interchangeable electronic devices and having an input/output connector. The enclosure includes a front cover coupled to the rear base. The enclosure includes a backplane within the cavity of the rear base and having a printed circuit board. The enclosure includes a flexible adapter that electrically connects the printed circuit board with the input/output connector. The flexible adapter has a signal routing layer that is etched to form a cross-hatched ground (or power) plane.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Disclosed herein are enclosures and systems for carrying, interfacing and connecting one or more signal modules to a host electronic device. Particular embodiments of the subject matter described in this specification may be implemented to realize one or more of the following advantages. An enclosure, such as a Ground Communication Filter Unit (GCFU), is able to connect to a host electronic device and provide an interface between the host electronic device and another electronic device, such as a filter module. The enclosure provides a modular design that allows for interchangeability among different types of electronic devices, such as different types of transient protection modules (TPMs) or filter modules. By having a modular design, the enclosure is reconfigurable without interruption to the operation of the other inserted electronic devices. That is, the enclosure may be reconfigured to receive any number of electronic devices and/or different types of electronic devices. The modular design allows easy reconfiguration of the number and types of stored electronic devices.

The electronic devices may be arranged in any number of configurations, e.g., vertically and/or horizontally, within the enclosure. For example, TPMs may be arranged in any number of rows and/or columns. The flexibility allows for the number and arrangement of the electronic devices to be configured and reconfigured depending on the task. For example, a first task may require use of four analog filters. Upon completion of the first task, the enclosure may be easily reconfigured to support a second task requiring the use of four digital filters instead of the four analog filters without having to rewire the enclosure. Thus, the enclosure saves time and provides interoperability to perform different tasks that require different electronic devices.

Other benefits and advantages may include the capability to connect to electronic devices that are mis-aligned. For example, if a connector of an electronic device does not align with the connectors on the printed circuit boards within the enclosure, the connectors on the printed circuit board may float about an axis to electrically connect with the electronic device. Moreover, aspects of the enclosure reduce wiring error within the enclosure and provide a connection to the external input/output interface. Thus, the enclosure assists in maintaining signal connectivity between an electronic device and the host electronic device.

Additionally, the modularity of the electronic devices allows for easier removal and maintenance of the electronic devices for repair. Thus, service costs and time are reduced.

Figure 1:
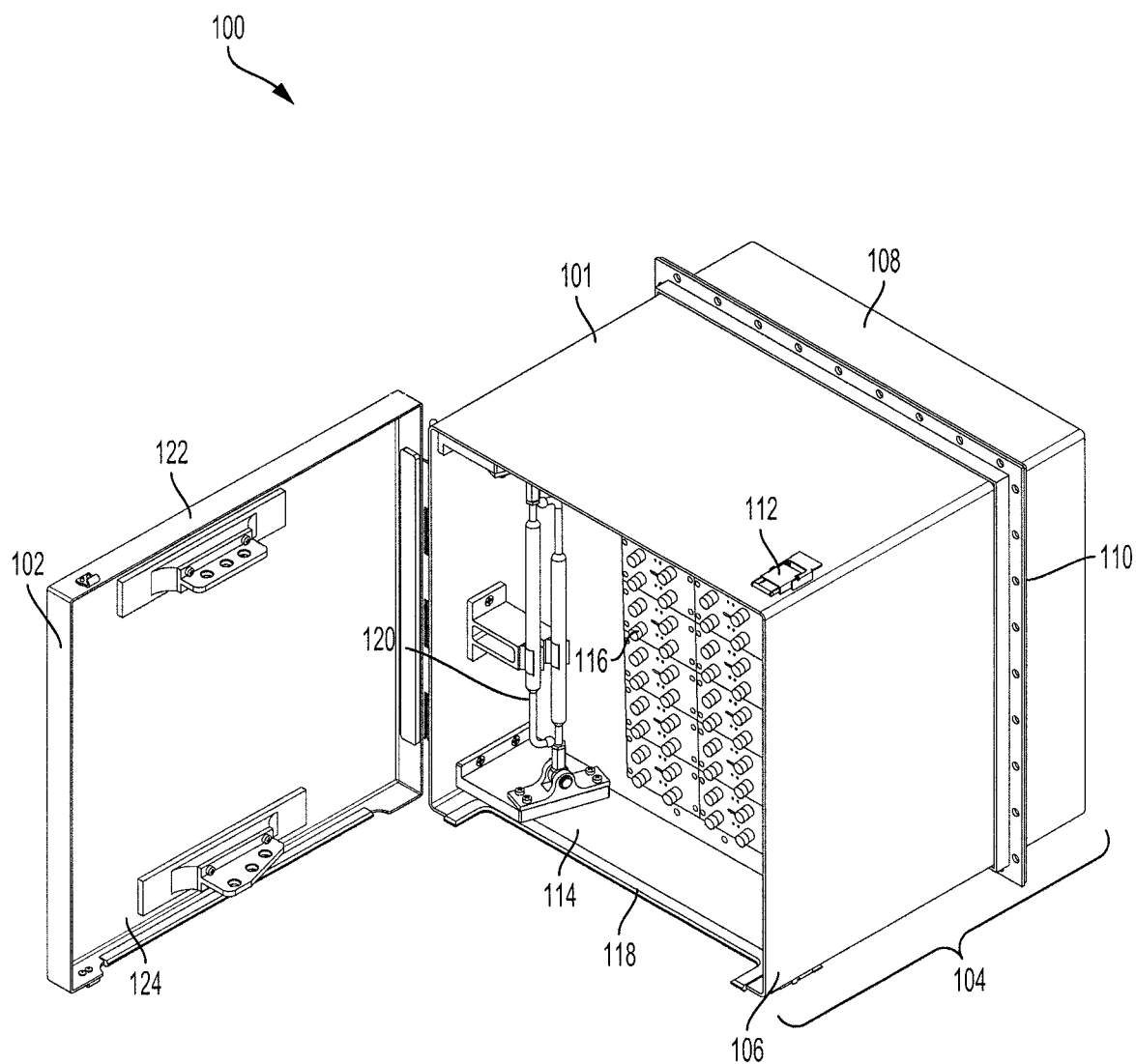
FIG. 1 is a front view of an enclosure system for providing signal filtering according to an aspect of the invention.

FIG. 1 is a front view of an enclosure system for providing signal filtering. The enclosure system 100 includes an enclosure 101 that holds and protects one or more electronic devices 116. The enclosure 101 provides an interface between the one or more electronic devices 116 and a host electronic device. The enclosure 101 may be mounted onto the host electronic device, wall or other surface.

The enclosure 101 protects the one or more electronic devices 116 from shock, dust, dirt, weather, water, heat and other environmental conditions or damage. The enclosure 101 may meet or exceed one or more governmental requirements to withstand environmental conditions, such as vibration, shock or stress thresholds. The enclosure 101 may have physical dimensions of approximately 16.5 inches by 18 inches by 18 inches, and the exposed surfaces of the enclosure 101 may be coated with a non-reflective coating.

The one or more electronic devices 116 that are inserted into the enclosure 101 may be one or more signal modules and/or one or more filter modules, e.g., one or more transient protection modules (TPMs). The one or more transient protection modules protect different signal types. The different signal types being protected may include analog, digital, loudspeaker, T1/E1, Digital Subscriber Line (DSL), Ethernet, Power over Ethernet (PoE) or various others. The TPMs that are stored and protected in the enclosure 101 are described in U.S. Pat. No. 9,190,837, which is hereby incorporated by reference herein.

The enclosure 101 has a front cover 102 and a rear base 104. The front cover 102 may define an internal cavity 124. The front cover 102 may have a wind stop to protect the enclosure 101 from the wind. The rear base 104 may define an internal cavity 114. The one or more electronic devices 116 are held within the internal cavities 114, 124 of the enclosure 101.

The front cover 102 is movable between an open position and a closed position. The front cover 102 may have a lip 122 that covers the outer perimeter edge of the rear base 104 when the front cover 102 is in the closed position. The rear base 104 and/or front cover 102 may have a gasket 118 that runs along the outer perimeter edge such that when the front cover 102 is in the closed position incoming cabling is protected from abrasion.

The enclosure 101 may have one or more latches 112. The latch 112 may snap or latch onto the front cover 102 when the front cover 102 is in the closed position to secure the front cover 102 to the rear base 104. The enclosure 101 may have a door stay 120. The door stay 120 may be connected to an inner surface of the rear base 104 and an inner surface of the front cover 102. The door stay 120 may be configured to prop the front cover 102 in the open position. The door stay 120 may be a door-biasing mechanism. That is, the door stay 120 may have a locked position and an unlocked position, such that when the door stay 120 is in the locked position and the front cover 102 is in the open position, the door stay 120 props the front cover 102 open. But, when the front cover 102 is open and the door stay 120 is in the unlocked position, the front cover 102 may be moved into the closed position.

The rear base 104 may segregate the internal cavity 114 into an electrically dirty portion 106 and an electrically clean portion 108. The dirty portion 106 may be an area susceptible to electro-magnetic interference (EMI) and/or electro-magnetic conductance (EMC). The clean portion 108 may be an area protected against EMI and/or EMC. The clean portion 108 may house an inserted electronic device, such as a TPM. The inner surface of the clean portion 108 may have an anodized coating, chromate conversion coating, or other protective (and preferably conductive) coating.

The rear base 104 may segregate the internal cavity 114 into the two portions using a dividing wall. The mounting flange 110 forms an annular ring around the enclosure 101 that seals out EMI/EMC from the host electronic device. The mounting flange 110 may have a gasket on the back side toward the host electronic device, i.e., the side toward the clean portion 108. The mounting flange 110 may be used to mount the enclosure 101 to the host electronic device.

Figure 2:
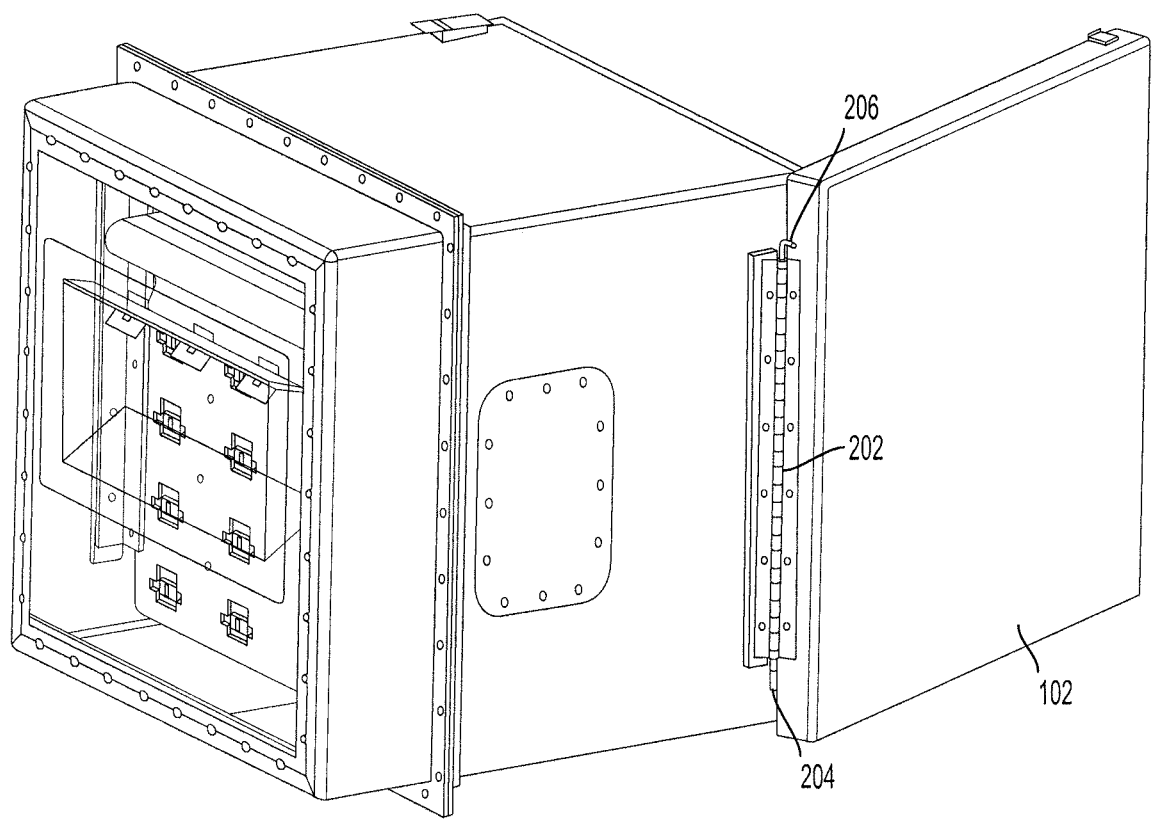
FIG. 2 is a side view of the enclosure of FIG. 1 according to an aspect of the invention.

FIG. 2 is a side view of the enclosure 101. The front cover 102 may use a securing mechanism, such as a hinge 202, to swing between the open position and the closed position and secure the front cover 102 to the rear base 104. The securing mechanism may include the hinge 202 and a pin 204. The hinge 202 may be fastened to the front cover 102 and the rear base 104 and interconnect to secure the front cover 102 with the side surface of the rear base 104 when the pin 204 is inserted.

The hinge 202 may run vertically along a longitudinal axis that extends from a point near a top surface of the enclosure 101 to a point near the bottom surface of the enclosure 101. The hinge 202 extends along a portion of the perimeter of the outer surface of the front cover 102 and a portion of the outer side surface of the rear base 104. The hinge 202 has a central through-hole that extends along the longitudinal axis and receives the pin 204. In some implementations, the hinge 202 may run horizontally from a point near a side surface of the enclosure 101 to a point near an opposite side surface of the enclosure 101 on the top surface of the enclosure 101 or the bottom surface of the enclosure 101 to open in a vertical direction.

The pin 204 has a top end and a bottom end. The top end of the pin 204 may have a service handle 206 that allows a user to lift and remove the pin 204 and guide the pin 204 through the through-hole of the hinge 202. A hairpin cotter pin, e-clip, or key ring at the bottom end of the pin 204 may secure the pin 204 within the hinge 202. The pin 204 secures the front cover 102 to the rear base 104 when inserted. When the pin 204 is removed, the front cover 102 is removable from the rear base 104.

Figure 3:
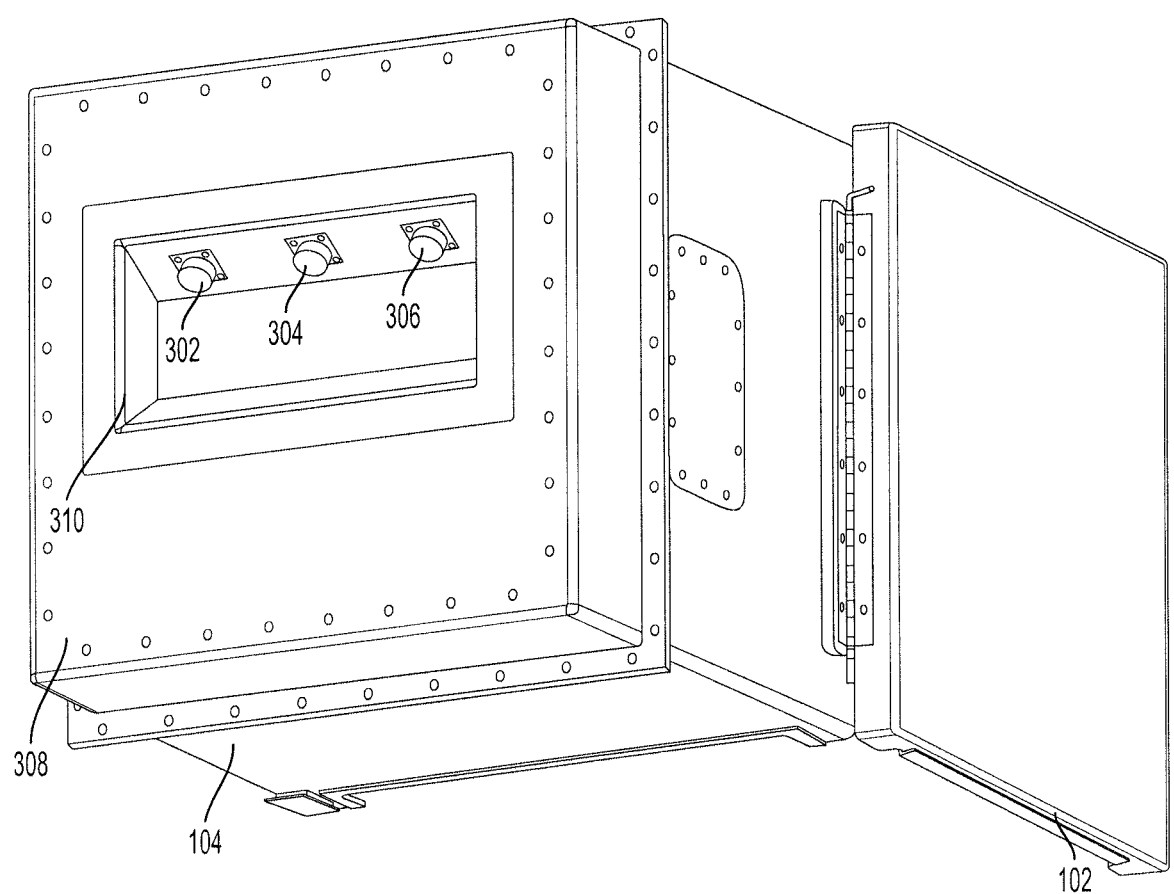
FIG. 3 is a rear view of the enclosure of FIG. 1 according to an aspect of the invention.

FIG. 3 is a rear view of the enclosure 101. The rear base 104 has a rear surface 308. The rear surface has a recessed region 310. One or more input/output connectors, e.g., input/output connectors 302, 304, and 306, extend from within the cavity 114 of the rear base 104 outward through the rear surface 308 so that the one or more input/output connectors 302, 304 and 306 are exposed outward from the rear surface 308. The one or more input/output connectors 302, 304 and 306 may connect to the host electronic device and allow a signal inputted through the one or more electronic devices 116 to pass or filter through to the host electronic device.

Figure 4:
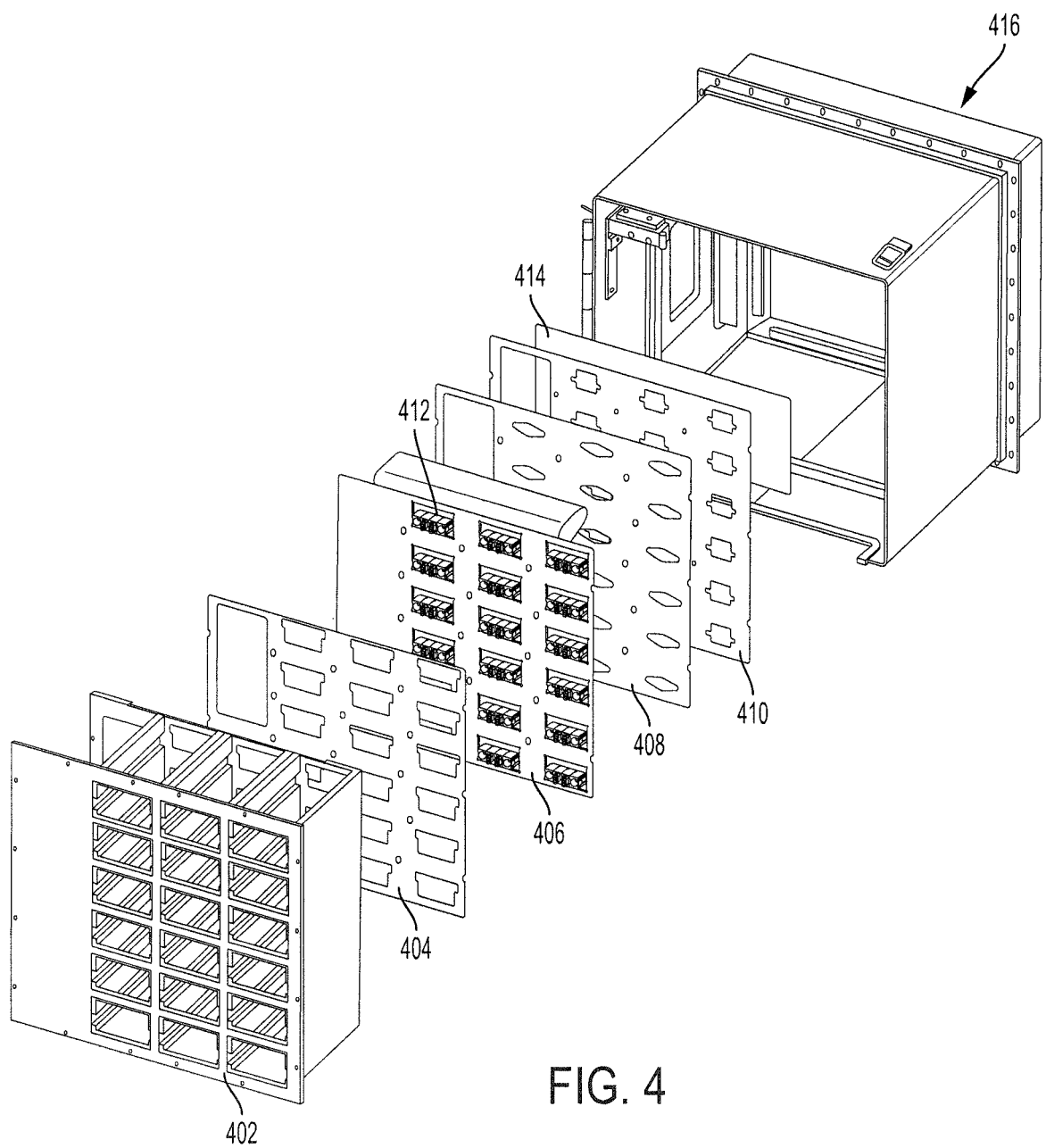
FIG. 4 is an exploded view of the interior of the enclosure of FIG. 1 according to an aspect of the invention.

FIG. 4 is an exploded view of the interior of the enclosure 101. The interior of the enclosure 101 includes a drawer chest 402 and a chassis 416. The chassis 416 and the drawer chest 402 may be brazed using an aluminum brazing process to provide EMI protection. The chassis 416 may have a first slide plate 404, a flex backplane 406 with one or more floating printed circuit boards 412 attached to a flex interconnect 804, a second slide plate 408, a backplane support 410 and/or a cover 414. The enclosure 101, the drawer chest 402, and the backplane support 410 may be made of aluminum or other metal. The slide plates 404, 408 are non-metal, such as Delrin® (acetal) or Teflon® (Polytetrafluoroethylene or PTFE). In some implementations, the enclosure 101 has a monolithic backplane and instead of the slide plates 404, 408, has only a backplane support 410. In this configuration, the backplane support 410 would be non-metal, such as Delrin® (acetal) or Teflon® (PTFE).

The drawer chest 402 is further described below in reference to FIG. 5. The first slide plate 404 may be connected to a back end of the drawer chest 402. The flex backplane 406 may be connected to and in between the first slide plate 404 and the second slide plate 408. The second slide plate 408 may be connected to the backplane support 410.

Figure 16:
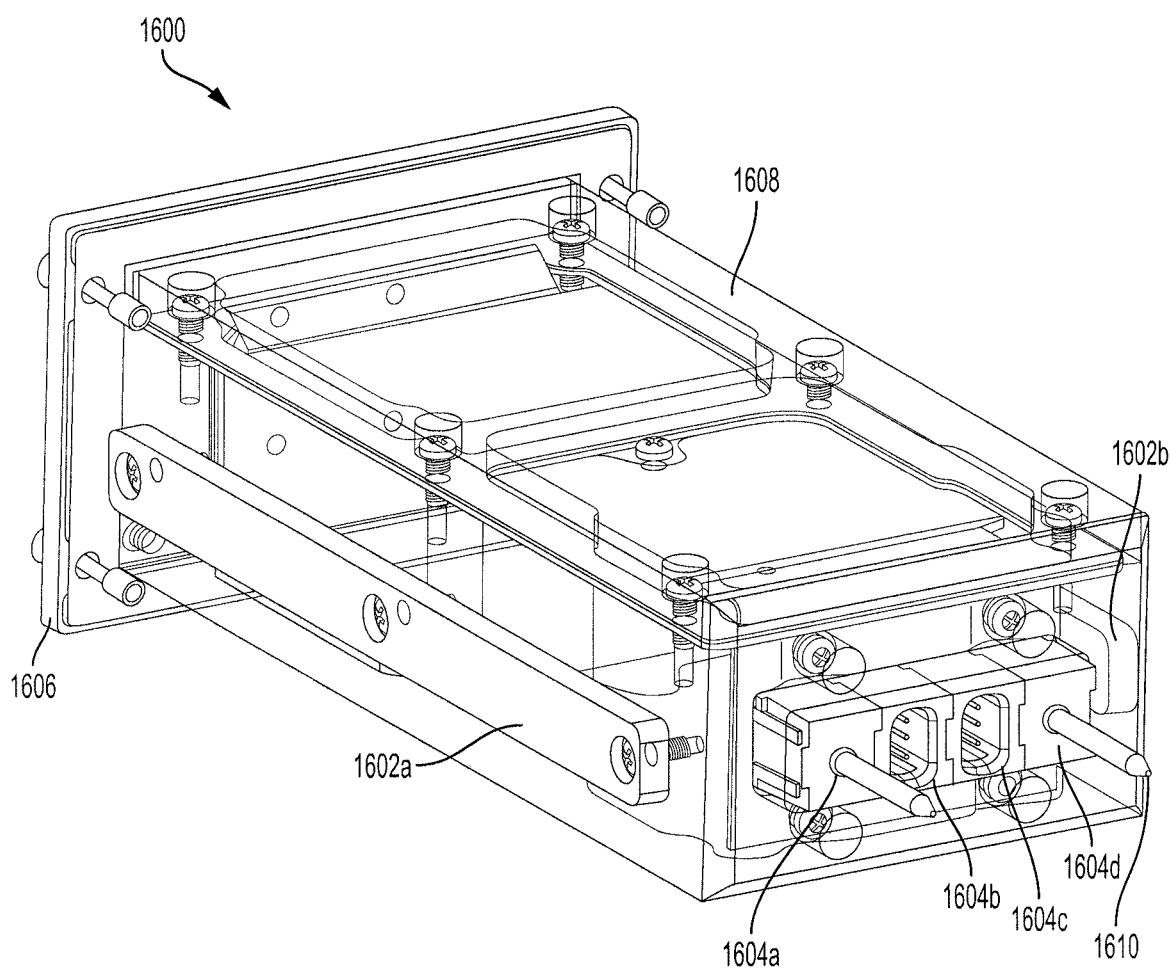
FIG. 16 is a rear view of a transient protection module according to an aspect of the invention.

The flex backplane 406 may have one or more printed circuit boards 412 that connect to one or more connectors of at least one of the one or more electronic devices 116, such as connectors 1604a-d of the transient protection module 1600 as shown in FIG. 16, when the at least one of the one or more electronic devices 116 is inserted into one of the drawers 502. At least one of the first slide plate 404, the second slide plate 408, the backplane support 410 or the flex backplane 406 may be configured to allow one or more printed circuit boards 412 to float. That is, if the one or more connectors on the printed circuit boards 412 are mis-aligned with the one or more connectors on a corresponding electronic device 116 the one or more connectors on the printed circuit boards 412 may be able to move or angle to maintain or establish the connection with the connectors on the corresponding electronic device 116.

Different types of the one or more electronic devices 116 may connect to the one or more printed circuit boards 412. For example, any of the different types of TPMs including a 4-post analog transient protection module 1100, a loudspeaker 2-post transient protection module 1200, a 4-post digital transient protection module 1300, a T1/E1 transient protection module 1400, or an Ethernet transient protection module 1500, as shown in FIGS. 11-15 respectively, may connect to the one or more printed circuit boards 412. The enclosure 101 may receive any one of the different types of the one or more electronic devices 116 in one of the multiple drawers 502 to connect to one of the one or more printed circuit boards 412.

The backplane 406 supports one or more signals having a power of up to 300 Volts (V) and 2 Amps (A) on all lines as well as support for up to a 1 Gigabit/Second (Gbps) differential signal. The different components within the chassis 416 including the traces on the one or more printed circuit boards 412, the one or more connectors on the one or more printed circuit boards 412, and the one or more input/output connectors 302, 304 and 306 are designed to support the one or more signals having a power of up to 300 V and 2 A and/or a digital signal with a speed of up to 1 Gbps.

The different components may use material considerations, such as a printed circuit board (PCB) laminate that has a dielectric constant of 5.4 at 1 MHz, in conjunction with a copper weight of approximately 1 ounce, a trace width of approximately 14-15 mils and/or a minimum trace spacing of 20 mils, or have other design configurations to support the signal having 300V, 2 A of continuous power. An example of the PCB laminate is a polyimide that meets the IPC-4101/41 or IPC-4101/42 standards.

The different components may have matching pair to pair traces of the same length for each channel and among the different channels. That is, the transmission line length and the receive line length are of approximately the same length and may be approximately the same length across different channels. By having matching pair to pair traces of the same length, delay is minimized for each channel and bidirectional communication is optimized.

Additionally, the tracing supports a differential impedance of approximately 100 ohms to support transmission of an Ethernet signal. To support the 100 ohm impedance, the traces in a pair may have a width of approximately 14 mils or 15 mils, with a spacing of approximately 35 mils or 20 mils, respectively. The spacing between different pairs may be approximately 5 times the trace width and/or a minimum of 70 mils to minimize crosstalk. Moreover, for a given signal pair there may be an equal number of vertical interconnected accesses (Vias) to assist in minimizing delay while interconnecting layers to maximize space.

Figure 8:
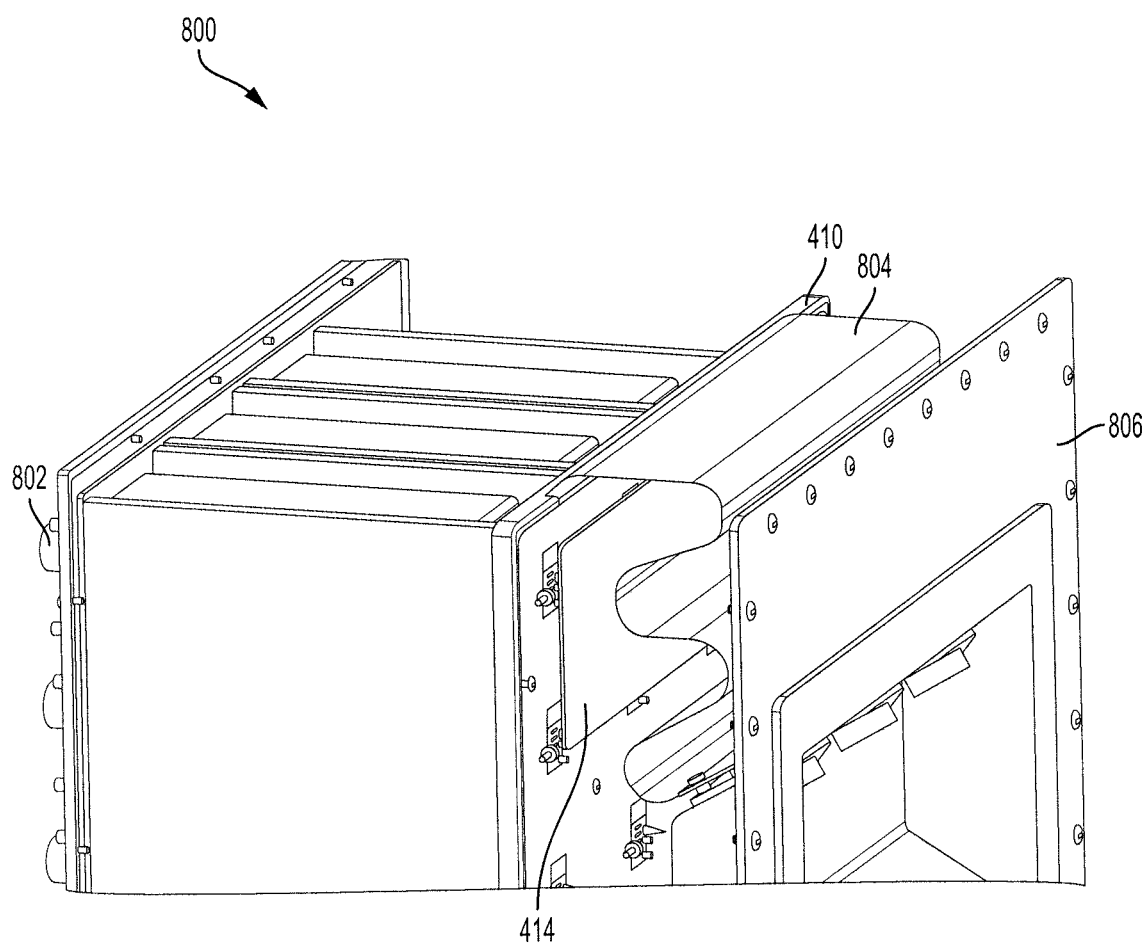
FIG. 8 is an interior view of the enclosure of FIG. 1 showing an interconnection of the signal devices to the input/output connectors according to an aspect of the invention.

A cover 414 may connect in between the backplane support 410 and a flex interconnect 804, as shown in FIG. 8. The flex interconnect 804 may be a flexible harness, flexible adapter, flexible printed circuit or other connector or interconnect. The cover 414 may protect one or more module guide pins that stick through the backplane support 410 from rubbing against the flex interconnect 804.

Figure 5:
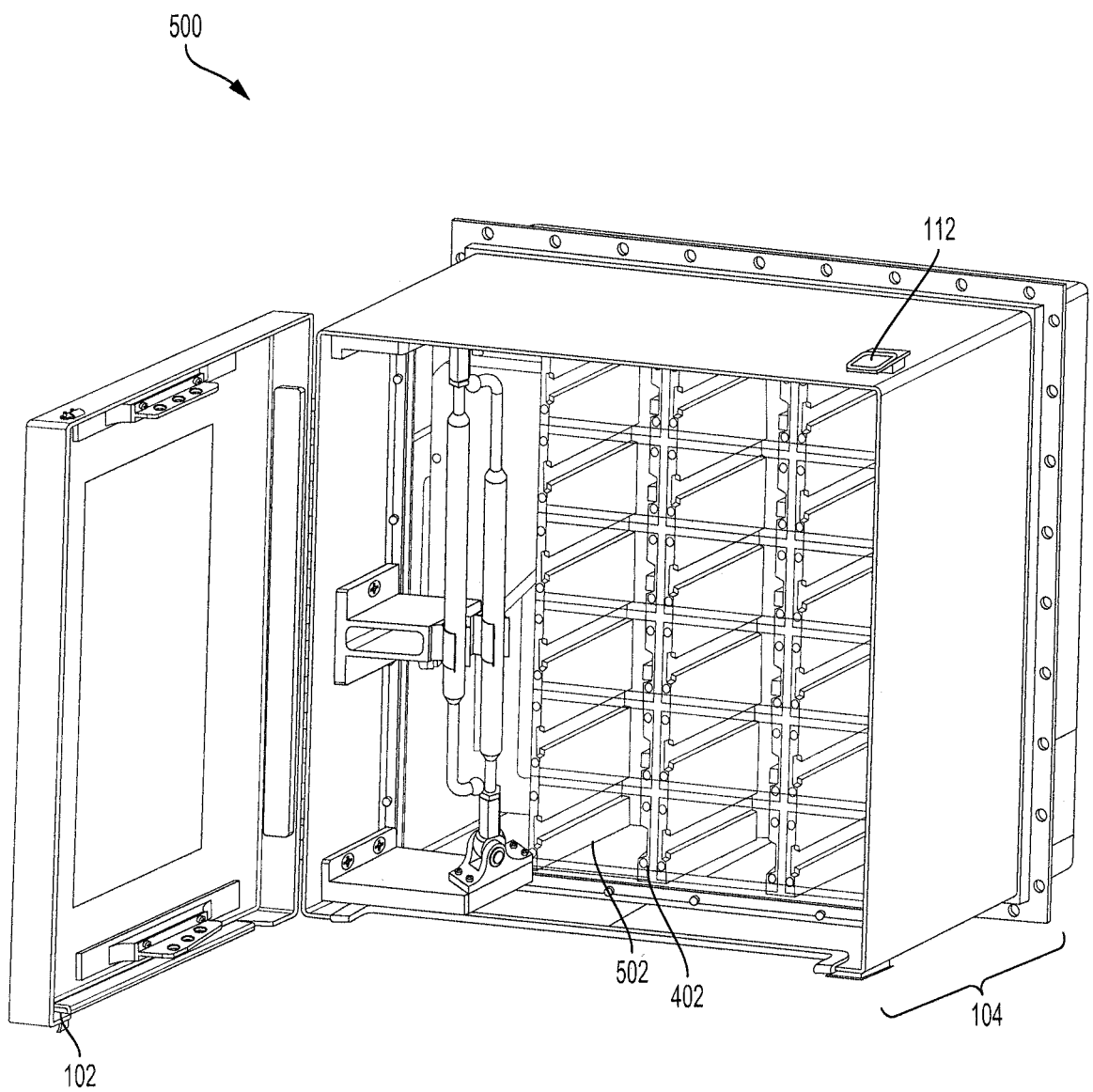
FIG. 5 is an inside view of the front of the enclosure of FIG. 1 according to an aspect of the invention.

FIG. 5 is an inside view of the front of the enclosure 101 with the front cover 102 open. A drawer chest 402 is inside the enclosure 101 and within the cavity 114. The drawer chest 402 has multiple drawers 502. The drawer chest 402 may arrange the multiple drawers 502 in any number of rows and/or columns in any number of configurations. For example, the enclosure 101 has 6 rows and 3 columns of drawers for a total of 18 drawers. Any number of the one or more electronic devices 116 may be placed in the drawers 502 in any configuration depending on the application and/or host electronic device. If no electronic device is inserted into an empty drawer, a cover plate would need to be installed in that position. For example, a first set of electronic devices may be inserted into the first column of drawers 502. The first set may then be removed and a second set of electronic devices may be inserted in the third row of drawers 502. The modularity of the electronic devices 116 provides flexibility in adding, removing and/or reconfiguring the placement of the electronic devices 116 which allows easy access to the electronic devices 116 and simplifies configuration of the electronic devices 116 for different applications.

The multiple drawers 502 have a cavity that extends along an axis from an opening of the cavity 114 to the rear of the rear base 104. The cavity of the multiple drawers 502 receives the one or more electronic devices 116. The multiple drawers 502 may receive different types of the one or more electronic devices 116. For example, any of the different types of TPMs may be received within one of the multiple drawers 502 of the drawer chest 402.

Figure 6:
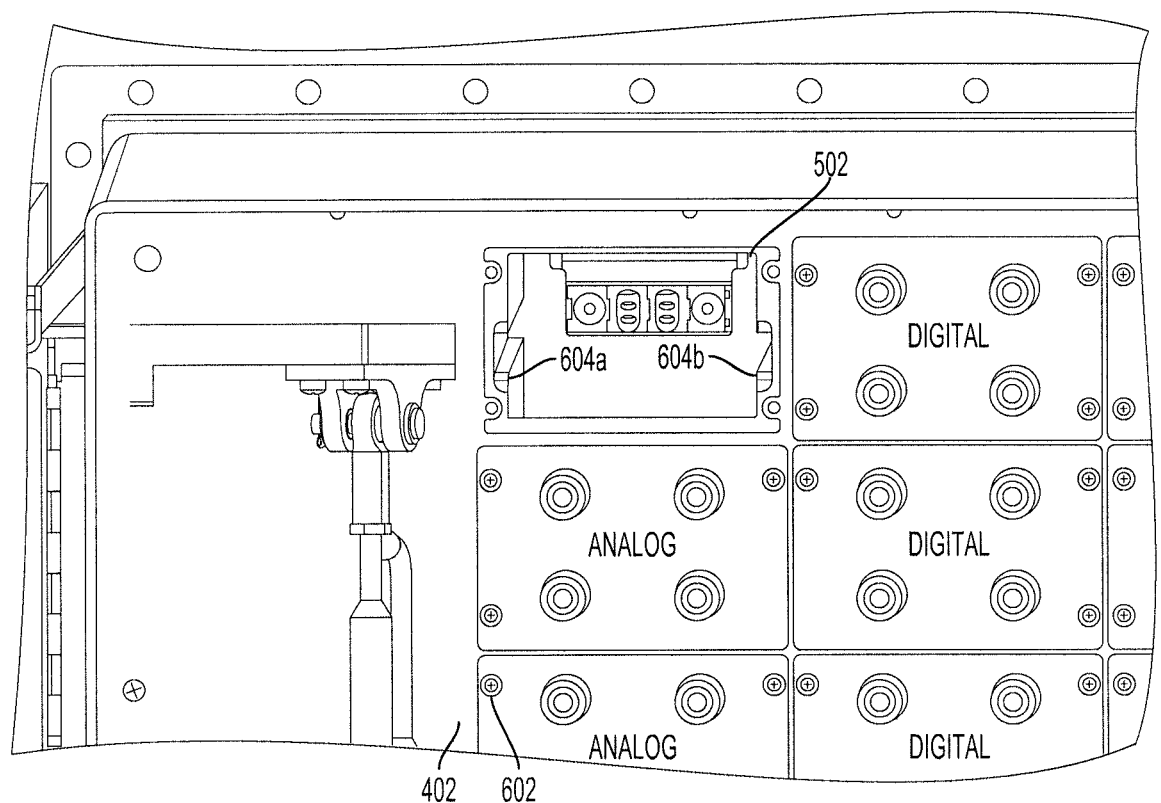
FIG. 6 is an exploded view of the drawers of the drawer chest of the enclosure of FIG. 1 according to an aspect of the invention.

Each of the drawers 502 may have a sliding mechanism to receive an electronic device. The sliding mechanism may be two rail interfaces, e.g., rail interfaces 604a-b of FIG. 6, that are on opposite sides of each of the drawers 502. The rail interfaces 604a-b may receive the rails 1602a-b of the transient protection module 1600, as shown in FIG. 16, when the transient protection module 1600 is inserted into one of the drawers 502. Each of the drawers 502 may have EMI Shielding surrounding the opening of the drawer to maintain the EM barrier of the enclosure, and may be mounted to the drawer chest 402 using one or more fasteners 602, such as a screw.

Figure 7:
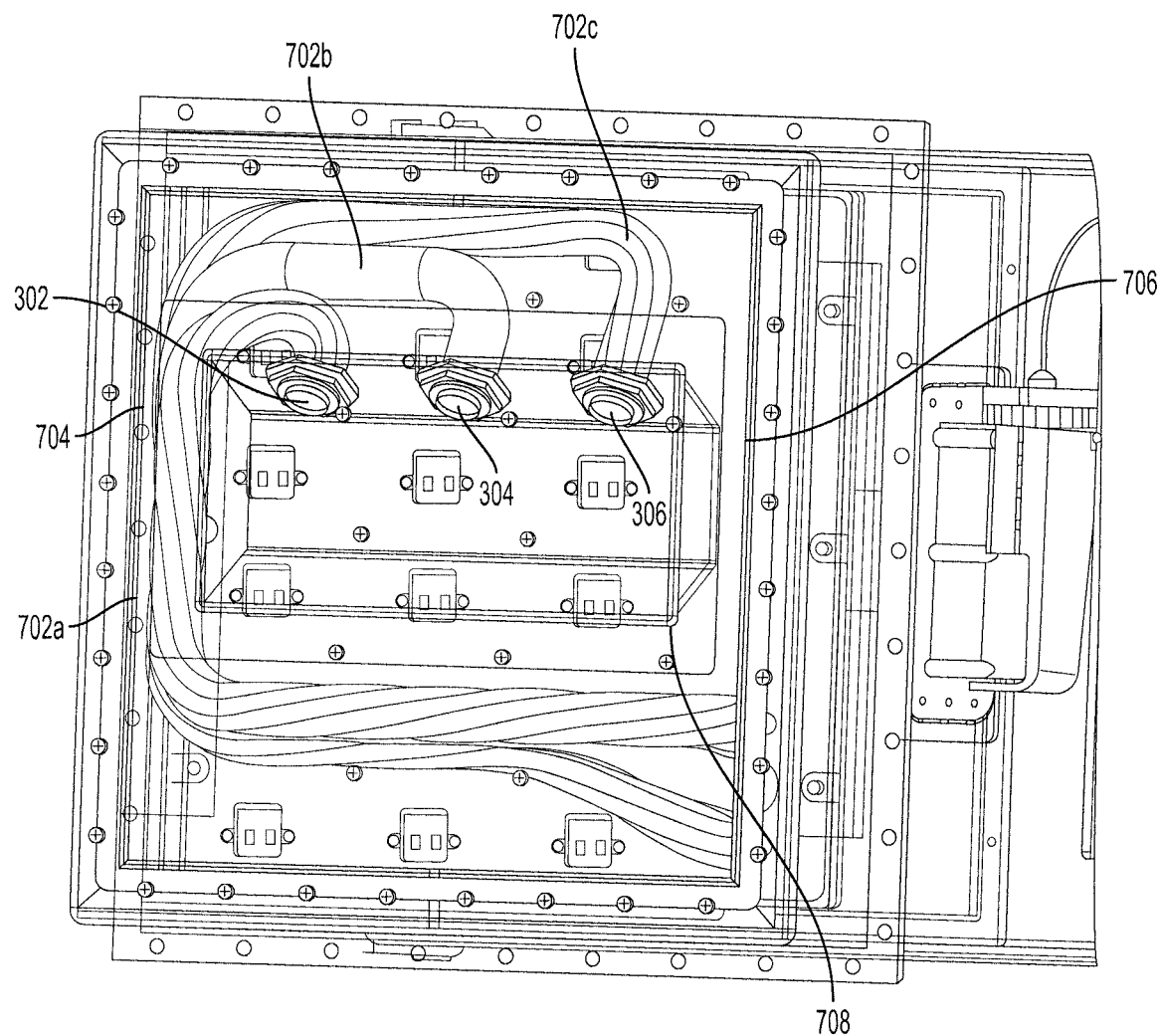
FIG. 7 is an interior view of the rear portion according to an aspect of the invention.

FIG. 7 is an interior view of the rear portion of the enclosure 101. The rear portion has the one or more input/output connectors 302, 304 and 306 that are exposed outward of the rear surface 308. The one or more input/output connectors 302, 304 and 306 are housed within the rear base 104 and are exposed from the enclosure 101 from the recessed region 708. Wires from the one or more printed circuit boards 412 may be bundled behind the backplane support 410 into one or more cables 702a-c to connect to the one or more input/output connectors 302, 304 and 306. The one or more cables 702a-c may be routed along one or more cable paths, such as the cable paths 704 and 706. The one or more input/output connectors 302, 304 and 306 may connect to the host electronic device, for example, when the enclosure 101 is mounted onto the host electronic device.

Figure 18:
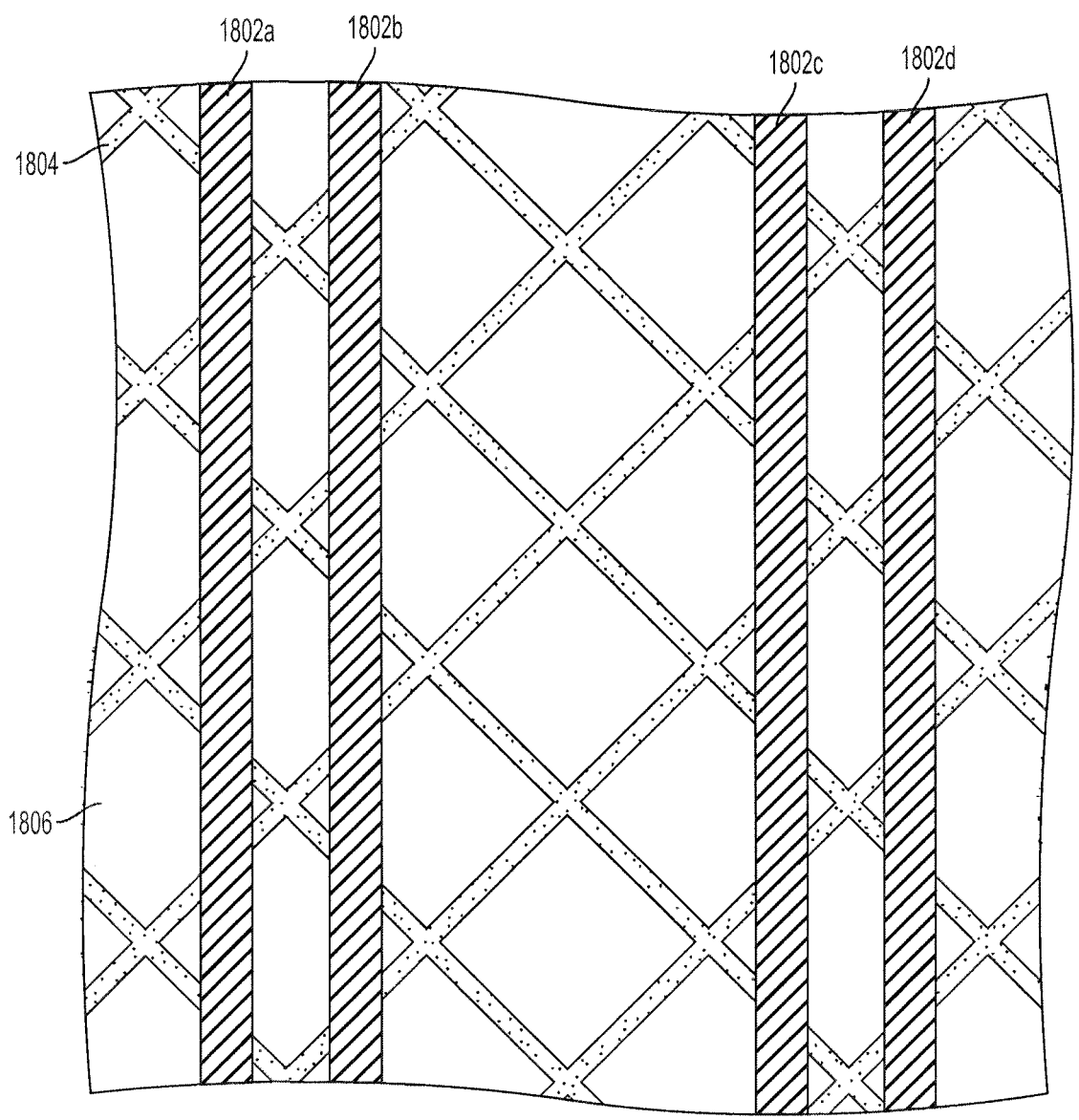
FIG. 18 is an example of the cross-hatched ground (or power) plane according to an aspect of the invention.

In some implementations, the one or more printed circuit boards 412 are connected to the one or more input/output connectors 302, 304 and 306 through a flex interconnect 804, as shown in FIG. 8. The flex interconnect 804 connects to the input/output connectors 302, 304 and 306 to provide external input/output. The flex interconnect 804 reduces the potential for wiring error within the enclosure 101. The flex interconnect 804 may have a flexible printed circuit that is a flexible region that electrically connects the one or more printed circuit boards 412 of the backplane 406 with the one or more input/output connectors 302, 304 and 306. The flexible region may have a cross-hatched ground plane to achieve the 100 ohm impedance, as shown in FIG. 18 for example. The cross-hatched ground plane supports the one or more signals having a power of up to 300 Volts (V) and 2 Amps (A) within the flexible region.

Figure 17:
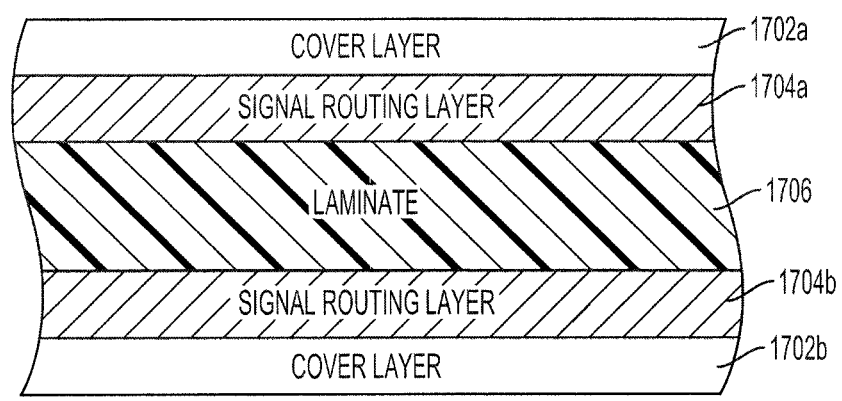
FIG. 17 is a cross-sectional view of an example flex interconnect according to an aspect of the invention.

The flexible region may be formed from multiple layers, as shown in FIG. 17 for example. The multiple layers may include one or more cover layers 1702a-b, one or more signal routing layers 1704a-b and a flexible laminate 1706. The one or more cover layers 1702a-b may be an adhesive coated dielectric, such as IPC-4203/1. The one or more signal routing layers 1704a-b may be a metallic layer, such as an ounce of Copper (Cu) foil. The flexible laminate may be made from IPC-4204 with a width of approximately 4 mil. The cover layers 1702a-b may enclose and/or surround the signal routing layers 1704a-b. The flexible laminate 1806 may be in between the signal routing layers 1704a-b and the cover layers 1702a-b.

The signal routing layers 1704a-b may be cross-hatched to form the cross-hatched ground (or power) plane. For example, the signal routing layers 1704a-b may be etched in a grid pattern 1804 with voids 1806 (or cross-hatched) that expose the flexible laminate 1706, such as the signal routing layer 1704a as shown in FIG. 18, for example. This creates the flexible region and allows for the 100 ohm impedance.

One or more traces 1802*a-d* may be on the signal routing layer 1704*a-b*. The grid pattern 1804 of the signal routing layers 1704*a-b* may be at or approximately at a 45 degree angle relative to the one or more traces 1802*a-d*. Each line of the grid pattern formed on the signal routing layer 1704*a-b* may have an approximate width of 5 mil, with a spacing of approximately 50 mil from another line formed on the signal routing layer 1704*a-b*. The cross-hatch grid pattern on the first signal routing layer 1704*a* may be at a 90 degree angle relative to the cross-hatch grid pattern on the second signal routing layer 1704*b* with the flexible laminate 1706 in between. The trace pairs 1802*a-b* and 1802*c-d* may be aligned to the cross-hatched ground plane for impedance matching.

Figure 9:
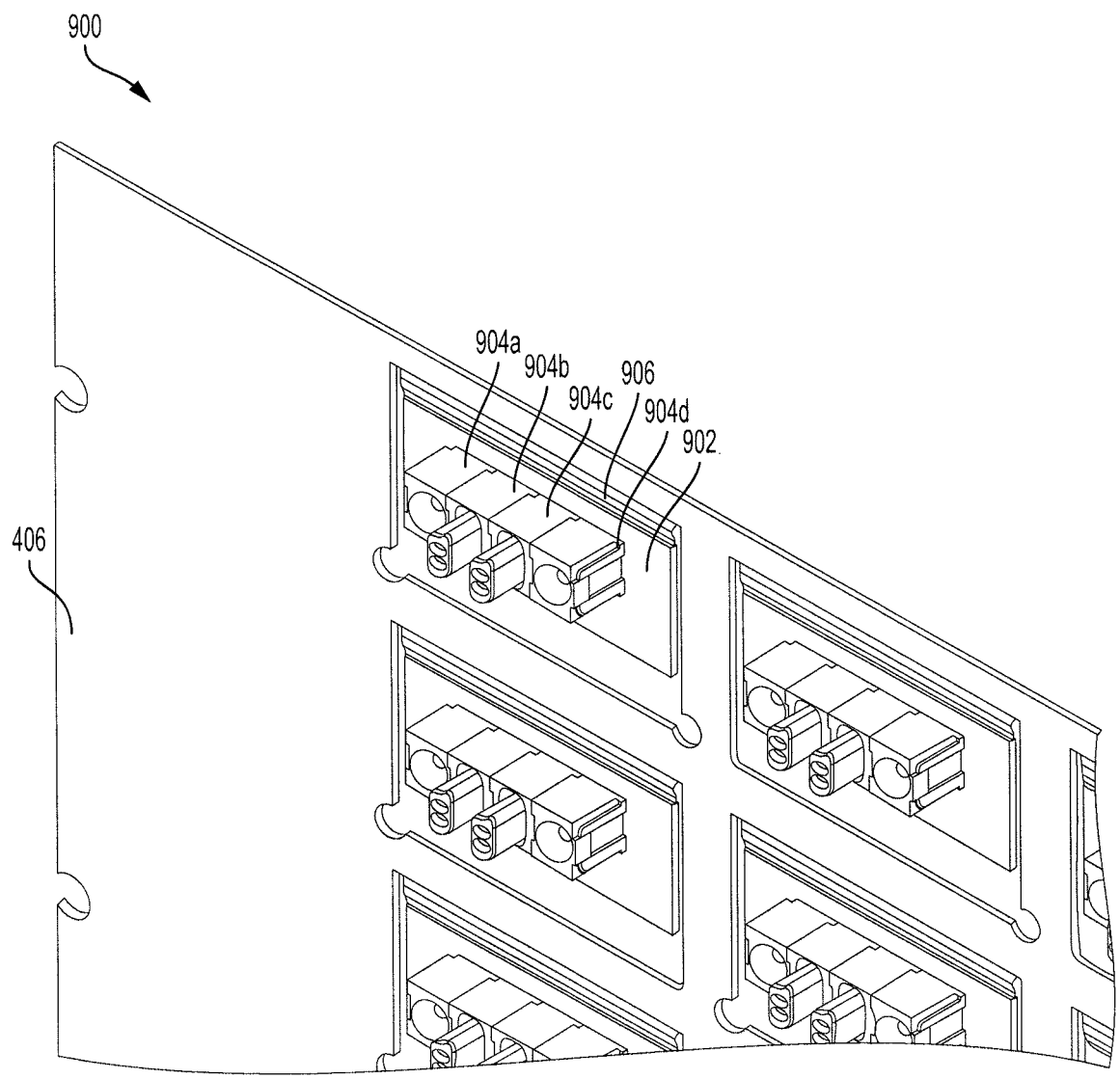
FIG. 9 is an exploded view of the one or more printed circuit boards according to an aspect of the invention.

FIG. 9 is an exploded view of the one or more printed circuit boards 412. The one or more printed circuit boards 412 on the flex backplane 406 may include one or more connectors 904*a-d*. The one or more connectors 904*a-d* may be self-aligning. The one or more connectors 904*a-d* may be female connectors, male connectors or a combination of both. The one or more connectors 904*a*-904*d* are configured to receive and/or insert into a corresponding connector of an inserted electronic device 116. The one or more connectors 904*a-d* may receive a corresponding connector of multiple different types of electronic devices 116. The different types of electronic devices 116 may be interchangeable with each other. For example, a first electronic device, such as a four-post analog transient protection module, may be inserted and connected to a printed circuit board. The first electronic device may then be removed and a second electronic device, such as a T1/E1 transient protection module, may be inserted and connected to the same printed circuit board.

The one or more connectors 904*a-d* may be mounted on a connector lobe 902. The connector lobe 902 may be connected to a flexible accordion attachment 904. The flexible accordion attachment 904 may attach to the flex backplane 406. The slide plates 404, 408 and the flexible accordion attachment 904 may allow the printed circuit board 412 to float or move vertically and/or horizontally so that the one or more connectors 904*a-d* may self-align and minimize the stress with one or more mis-aligned connectors of an inserted electronic device 116.

Figure 10:
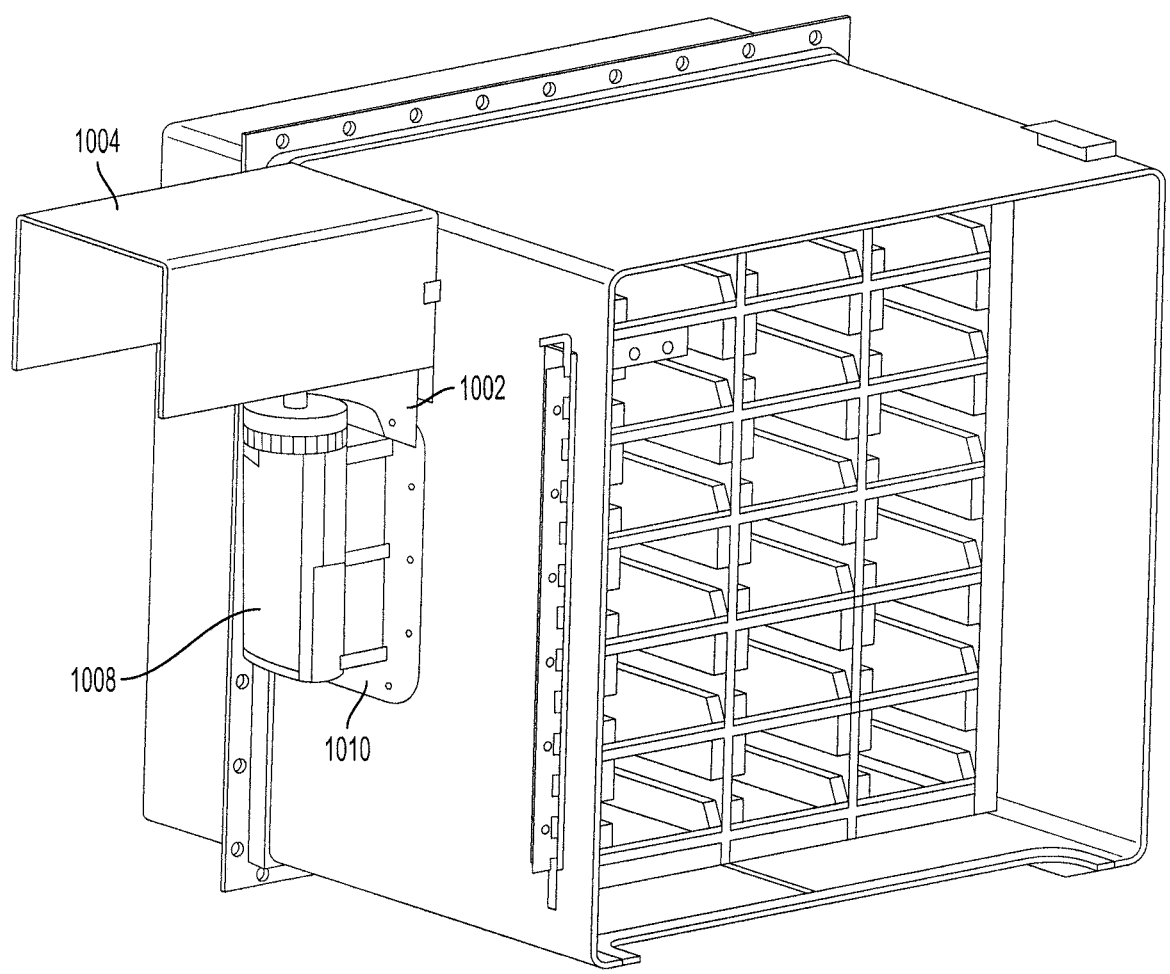
FIG. 10 is a side view of the enclosure showing an additional connector according to an aspect of the invention.

FIG. 10 is a side view of the enclosure 101 showing an additional filter module 1008. The enclosure 101 may have a side mount 1010 that is mounted on a side surface of the rear base 104. The additional filter module 1008 may be mounted using the side mount 1010. In some implementations, a rain cover 1004 is mounted to a mounting plate 1002 that is connected to the side mount 1010. The rain cover 1004 may be movable between a raised position (as shown) and a lowered position. When in the lowered position, the rain cover 1004 encloses the additional filter module 1008 and protects the additional filter module 1008 from rain ingress and/or other environmental conditions.

Figure 11:
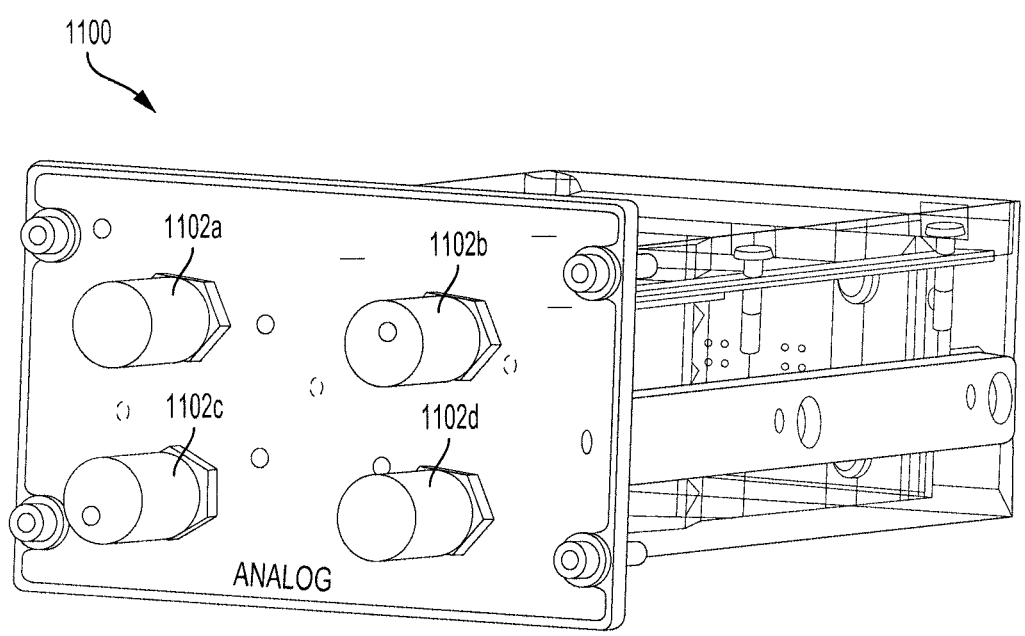
FIG. 11 is an illustration of a four-post analog transient protection module according to an aspect of the invention.
Figure 12:
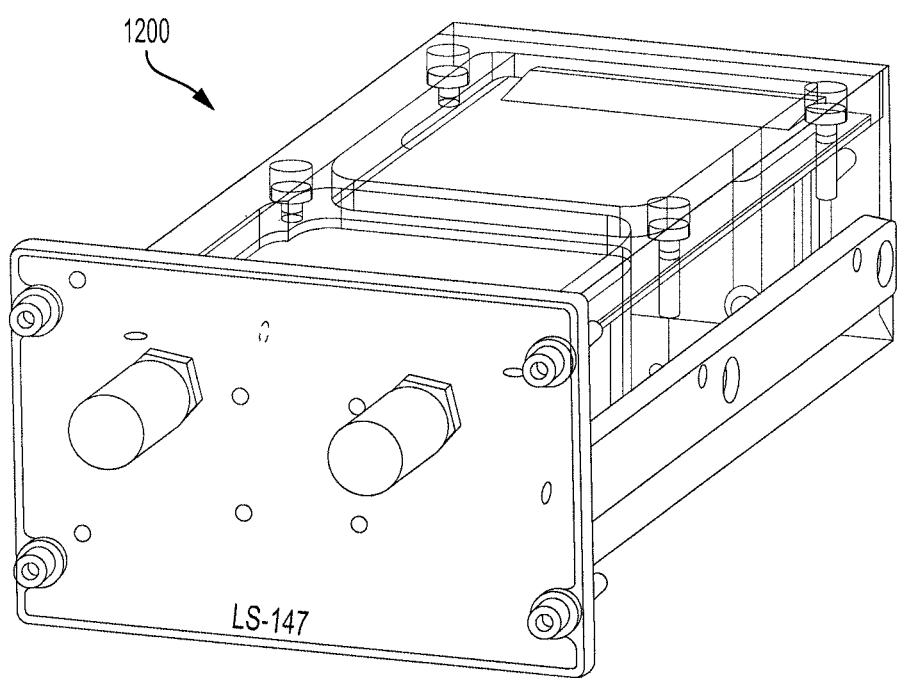
FIG. 12 is an illustration of a loudspeaker two-post transient protection module according to an aspect of the invention.

FIGS. 11-15 show different types of interchangeable transient protection modules. For example, FIG. 11 shows a four-post analog transient protection module 1100. The four-post analog transient protection module 1100 may have multiple binding posts 1102*a-d* to receive and filter a signal, such as an analog signal. The four-post analog transient protection module 110 may be one type of interchangeable transient protection module that is inserted into one of the drawers 502. FIG. 12 shows another type of interchangeable transient protection module, i.e., a loudspeaker two-post transient protection module 1200. The loudspeaker two-post transient protection module 1200 is another type of interchangeable transient protection module that may be inserted into one of the drawers 502. The loudspeaker two-post transient protection module 1200 may receive and filter a signal using two binding posts.

Figure 13:
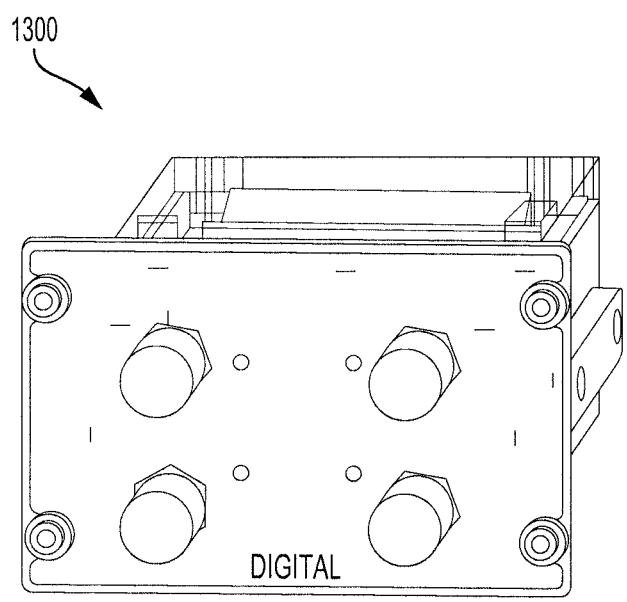
FIG. 13 is an illustration of a four-post digital transient protection module according to an aspect of the invention.
Figure 14:
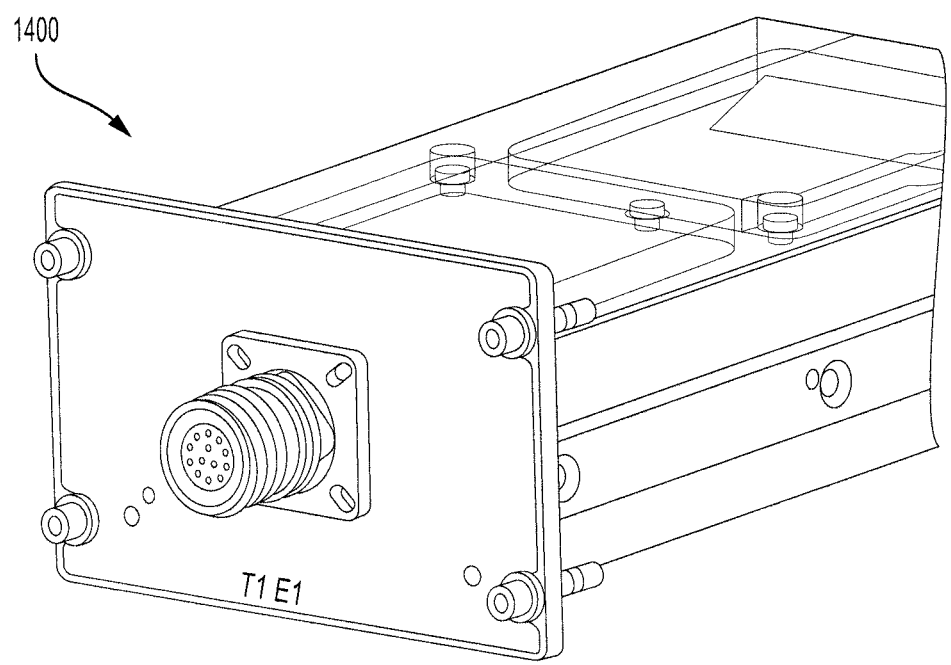
FIG. 14 is an illustration of a T1/E1 transient protection module according to an aspect of the invention.
Figure 15:
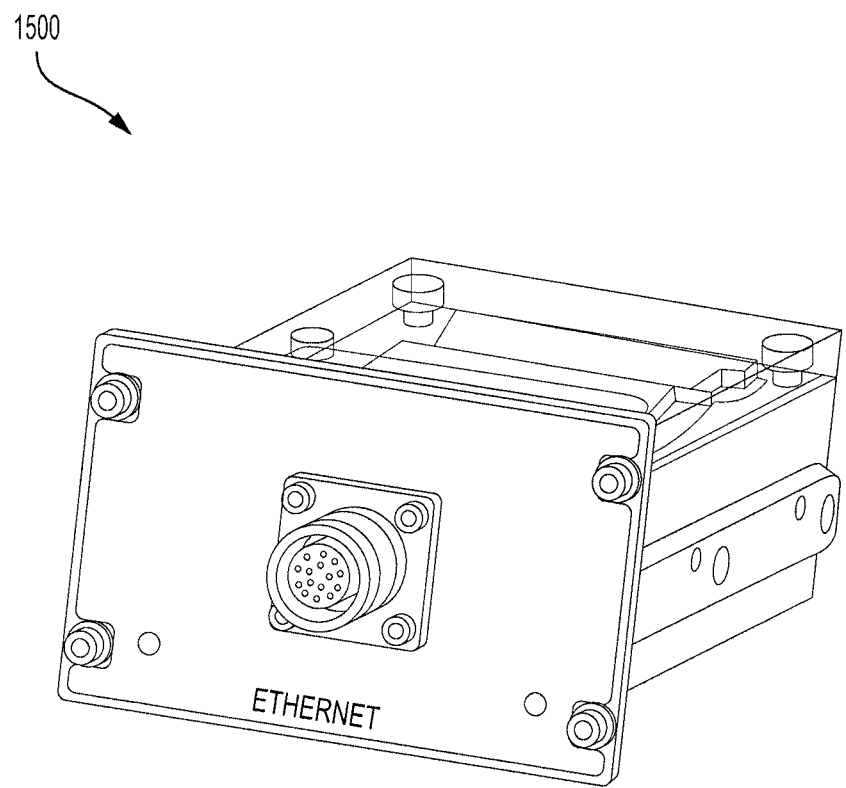
FIG. 15 is an illustration of an Ethernet transient protection module according to an aspect of the invention.

Other examples of different types of interchangeable transient protection modules that filter different types of signals are shown in FIGS. 13-15. FIG. 13 shows a four-post digital transient protection module 1300. The four-post transient protection module 1300 has four binding posts. The four post transient protection module 1300 receives and filters a digital signal and may be inserted into one of the drawers 502. In another example, FIG. 14 shows a T1/E1 transient protection module 1400. The T1/E1 transient protection module receives and filters a type of digital signal. The T1/E1 transient protection module may be inserted into one of the drawers 502. In another example, FIG. 15 shows an Ethernet transient protection module 1500. The Ethernet transient protection module 1500 receives and filters an Ethernet signal. The Ethernet transient protection module 1500 may be inserted into one of the drawers 502. Each of the different types of interchangeable transient protection modules may be inserted into any one of the drawers 502 and a combination of the different types of interchangeable transient protection modules may be inserted in different drawers. Each type receives and filters a different type of signal.

FIG. 16 is a rear view of a transient protection module 1600. The transient protection module 1600 has a housing 1608, a front panel 1606, and one or more connectors 1604. The housing 1608 may have a lid and may be made of aluminum. The front panel 1606 may have one or more binding posts, e.g., binding posts 1102*a-d* of FIG. 11. The binding posts may connect to a source signal that is to be filtered and may be surrounded with an insulator. The transient protection module 1600 may have multiple guide rails, e.g., rails 1602*a-b*, positioned on opposite sides of the transient protection module 1600. The rails 1602*a-b* may interface and slide into the one or more rail interfaces 604*a-b* of a drawer 502. The one or more connectors 1604*a-d* of the TPM 1600 may engage the one or more connectors 904*a-d* of the one or more printed circuit boards 412. The one or more connectors 1604*a-d* may have a pin 1610 that engages the one or more connectors 904*a-d* to guide and align the connector on the TPM with the connectors on the printed circuit boards 412 before the electrical contacts meet.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An enclosure for an electronic device, comprising:
   a rear base defining a cavity for holding the electronic device and having one or more input/output connectors;
   a front cover coupled to the rear base;
   a backplane within the cavity of the rear base and having a printed circuit board; and
   an interconnect that electrically connects the printed circuit board with the one or more input/output connectors, the interconnect having a first signal routing layer, a second signal routing layer that forms a cross-hatched ground or power plane, and a flexible laminate in between the first signal routing layer and the second signal routing layer.

2. The enclosure of claim 1, wherein the second signal routing layer is etched in a grid pattern having a plurality of lines and a plurality of voids in between the plurality of lines to form the cross-hatched ground or power plane.

3. The enclosure of claim 2, wherein the plurality of lines are angled relative to one or more traces on the cross-hatched ground plane.

4. The enclosure of claim 1, wherein the interconnect has a flexible printed circuit that has a plurality of layers including a first cover layer, a second cover layer, the first signal routing layer, the second signal routing layer and the flexible laminate, wherein the first cover layer and the second cover layer enclose the first signal routing layer, the second signal routing layer and the flexible laminate.

5. The enclosure of claim 4, wherein the first signal routing layer and the second signal routing layer are etched to form a plurality of lines in a grid pattern with a plurality of voids in between that expose the flexible laminate in between to form the cross-hatched ground or power plane.

6. The enclosure of claim 4, wherein the first cover layer and the second cover layer are made from an adhesive coated dielectric.

7. The enclosure of claim 1, wherein the first signal routing layer and the second signal routing layer are made from a copper foil.

8. The enclosure of claim 4, wherein the flexible laminate, the first signal routing layer and the second signal routing layer allow the interconnect to be flexible.

9. The enclosure of claim 1, wherein the cross-hatched ground or power plane has a layer thickness, a trace width, and a trace spacing that provides for a 100 ohm impedance.

10. A flexible adapter for connecting a connector and a printed circuit board, comprising:
a plurality of cover layers;
a plurality of signal routing layers enclosed within the plurality of cover layers and including a first signal routing layer and a second signal routing layer, the plurality of signal routing layers being etched to form a cross-hatched ground (or power) plane; and
a layer of flexible laminate in between the first signal routing layer and the second signal routing layer and configured to provide flexibility.

11. The flexible adapter of claim 10, wherein the cross-hatched ground (or power) plane provides additional flexibility.

12. The flexible adapter of claim 10, wherein the first signal routing layer is etched into a plurality of lines in a grid pattern having a plurality of voids.

13. The flexible adapter of claim 12, wherein the plurality of voids expose the layer of flexible laminate.

14. The flexible adapter of claim 12, wherein the plurality of lines in the grid pattern are angled relative to one or more traces on the first signal routing layer.

15. The flexible adapter of claim 10, wherein the plurality of cover layers include a first cover layer and a second cover layer, wherein the first cover layer and the second cover layer enclose or surround the plurality of signal routing layers and the layer of flexible laminate.

16. The flexible adapter of claim 10, wherein the plurality of cover layers are made from an adhesive coated dielectric.

17. The flexible adapter of claim 10, wherein the plurality of signal routing layers are made from copper (Cu).

18. An enclosure for protecting electronic devices, comprising:
a rear base defining a cavity for holding different interchangeable electronic devices and having an input/output connector;
a front cover coupled to the rear base;
a backplane within the cavity of the rear base and having a printed circuit board; and
a flexible adapter that electrically connects the printed circuit board with the input/output connector, the flexible adapter having a first signal routing layer, a second signal routing layer and a flexible laminate in between the first signal routing layer and the second signal routing layer, the first signal routing layer or the second signal routing layer being etched to form a cross-hatched ground or power plane.

19. The enclosure of claim 18, wherein the first signal routing layer or the second signal routing layer is etched in a grid pattern having a plurality of lines and a plurality of voids in between the plurality of lines.

20. The enclosure of claim 19, wherein a plurality of traces are on the first signal routing layer or the second signal routing layer and are configured to route a signal.

* * * * *